US007224622B2

(12) United States Patent
Chu et al.

(10) Patent No.: US 7,224,622 B2
(45) Date of Patent: May 29, 2007

(54) METHOD FOR WRITING DATA INTO MEMORY AND THE CONTROL DEVICE

(75) Inventors: Chih-Heng Chu, Hsinhua (TW); Ming-Cheng Chiu, Tainan (TW)

(73) Assignee: Himax Technologies, Inc., Hsinhua, Tainan County (TW)

( * ) Notice: Subject to any disclaimer, the term of this patent is extended or adjusted under 35 U.S.C. 154(b) by 103 days.

(21) Appl. No.: 11/056,196

(22) Filed: Feb. 14, 2005

(65) Prior Publication Data

US 2006/0181921 A1    Aug. 17, 2006

(51) Int. Cl.
*G11C 16/04* (2006.01)
(52) U.S. Cl. .......................... 365/189.05; 365/230.08; 365/233
(58) Field of Classification Search ........... 365/189.05, 365/230.08, 233
See application file for complete search history.

(56) References Cited

U.S. PATENT DOCUMENTS

| 6,707,399 | B1 | 3/2004 | Wang et al. |
| 6,940,760 | B2 * | 9/2005 | Borkenhagen et al. . 365/189.05 |

\* cited by examiner

*Primary Examiner*—David Lam
(74) *Attorney, Agent, or Firm*—Birch, Stewart, Kolasch and Birch, LLP

(57) ABSTRACT

A method for writing data into the memory, especially a method of preventing the data from overwriting for the write operation, is disclosed. The invention provides a control device for a memory system, which utilizes at least two layers of latches to hold the inputted data from a data bus and the data which prepares to be written into memory respectively. According to the control of communication between two layers of latches by the control device, the new inputted data of the succeeding write operation will not overwrite the data of the current write operation, thereby reducing the limitation for the cycle of writing (CYCW) and increasing the write speed.

21 Claims, 8 Drawing Sheets

METHOD FOR WRITING DATA INTO MEMORY AND THE CONTROL DEVICE

BACKGROUND OF THE INVENTION

1. Field of the Invention

The invention relates to a method and a control device for writing data into a memory, and more particularly relates to a method and control device for preventing data from being overwritten while writing data into memory.

2. Description of the Prior Art

Memory devices, such as SRAM, DRAM, or FLASHRAM, are used in many electronic devices. With the progress of processing rate for a processing unit (such as a CPU), the processing rate for memory devices has to be increased. For instance, a multi-port system that allows different read/write operations to be done simultaneously is applied in many memory devices. However, because of the ordinary limitations for small, portable electronic devices (e.g., power consumption, volume size, or heat dissipation), many of them prefer a single-port system rather than the multi-port system to store data and signals. For example, a single-port SRAM system is widely used in the IC driver for displaying images on the LCD panel of a mobile phone.

FIG. 1 illustrates the conventional single-port SRAM system 10 that is often seen in LCD IC driver of a mobile phone or a PDA. System 10 includes the following circuit components: a SRAM controller SRAM_CTRL 100; an arbiter 102; a timing controller TIMING_CTRL 104; and a SRAM 106. Among them, SRAM 106 is provided for storing the data of an electronic device; SRAM_CTRL 100 is an access controller, which electrically communicates with the CPU and controls of the external read/write operation for the SRAM 106. The TIMING_CTRL 104 repeatedly generates control signals CS to the SRAM 106 for performing an internal read operation that outputs data (e.g., pixel bits) stored in the SRAM 106 to the source driver (LCD panel) in order to display images; and the arbiter 102 determines which operation (external write, read, and internal read) will be performed to the SRAM 106. One characteristic of the single-port SRAM system is that only one read/write operation may be performed at the same moment. In this example, the internal read operation has a higher priority than the external read/write operation. The single-port SRAM system 10 has two operational modes, called the normal mode and the high speed write mode (HWM mode) respectively, for different demands of writing speeds. Functions for each component and the detail process for two operational modes will be described below. However, the descriptions will be focused on an external write operation for adapting to the aspects of the invention.

Data on a data bus is not directly written into SRAM 106 but temporarily held in the SRAM_CTRL 100 till obtaining the write permission from the arbiter 102. FIG. 2A illustrates a diagram for the SRAM_CTRL 100, and FIG. 2B shows the relevant timing diagram as in a normal mode. In the normal mode, when the CPU wants to write data into the SRAM 106, firstly it sends an external write request E_NWR to SRAM_CTRL 100. Before writing the data into the SRAM 106, firstly the data on a data bus originally will be input into a flip-flop FF, it will then input into different latches according to a latch address L_ADDR. As shown in FIG. 2A, there are four latches named as L1, L2, L3, and L4 respectively, therefore L_ADDR needs at least two bits to identify four latches (e.g., 00 for L1, 01 for L2, 10 for L3, and 11 for L4). In general, we may choose the last two bits of a write address ADDR as L_ADDR, therefore no additional address generator is needed (or at most a register for storing the last two bits of ADDR).

Referring to FIG. 2B, when the external write request E_NWR 20 comes and goes high, the data in flip-flop FF will be inputted into the latch L1 according to L_ADDR (202). In the same time, SRAN_CTRL 100 sends a request signal EXT_WR 22 to the arbiter 102 for permission for writing data into the SRAM 106. If it's allowable to write the data into the SRAM 106, the arbiter 102 will respond by sending an acknowledge signal EXT_PULSE 24 to the SRAM_CTRL 100. As receiving the acknowledge signal EXT_PULSE 24, SRAM_CTRL 100 generates and sends a clock signal CLK 26 immediately into the SRAM 106, which triggers the SRAM 106 writing data into the proper memory addresses according to the write address ADDR. Afterward, the clock signal CLK goes low, the value of L_ADDR is increased (00 to 01) (204), so that when a new E_NWR 28 comes and goes high, the new latch address L_ADDR will indicate latch L2 for the data to be input.

With regard to the HWM mode, E_NWR comes more rapidly than in the normal mode, and there are more write requests per complete write operation. Referring to FIG. 2C, which illustrates the relevant timing diagram for the SRAM_CTRL 100 as operating in the HWM mode. In the HWM mode, a complete write operation consists of four external write requests and a clock signal. When the E_NWR goes high (230), data in the flip-flop FF is inputted into each latch by reference to an latch address HWM_ADDR, which controls the access for latches in the high speed write mode. With a delay time (e.g., 10 ns) after E_NWR goes high, the value of the HWM_ADDR will automatically be changed (00 to 01) (232), that the new latch address HWM_ADDR will be applied to indicate which latch the succeeding data will be inputted as a new E_NWR comes. The foregoing steps repeat until the value of the HWM_ADDR becomes 11 (234), which indicates to the last latch (L4) for the write operation. Then the SRAM_CTRL 100 sends the request signal EXT_WR to the arbiter 102 for the write permission. In this moment, the data and the write address of the SRAM 106 are ready. When the arbiter 102 receives the request signal EXT_WR, the arbiter 102 will respond by sending an acknowledge signal EXT_PLUSE to the SRAM_CTRL 100 if it's allowable to write data into the SRAM 106 (EXT_WR and EXT_PULSE are not shown in drawing). After receiving the acknowledge signal EXT_PLUSE, the SRAM_CTRL 100 generates and sends the clock signal CLK (236) into the SRAM 106, thereby writing the data held in latches into the proper memory addresses according to the write address ADDR. In the next procedure, as the clock signal CLK goes low, the value of the ADDR is changed (238) to indicate the memory address of the SRAM 106 for the next write operation.

As foregoing descriptions, a complete write operation is accomplished after the clock signal CLK is generated and the value of the write address ADDR is changed. No matter which operational mode it is, however, a serious problem may occur when the clock signal CLK comes too late. In some situations, the arbiter 102 may not immediately respond to the request signal EXT_WR. For example, if the TIMING_CTRL 104 also sends an internal read request INT_RD to the arbiter 102 at the same time, the arbiter 102 will respond with an acknowledge signal IN_PULSE for the internal read request INT_RD prior to the external write request EXT_WR. Therefore, the acknowledge signal EXT_PULSE will arrive late to the SRAM_CTRL 100. A delayed EXT_PLUSE will result in a delayed clock signal CLK, thereby resulting in the clock signal CLK being generated after a succeeding write request E_NWR of new write operation.

In the normal mode, referring to the timing diagram of FIG. 2D, because the value of L_ADDR changes at the moment as the clock signal CLK goes low, hence if CLK comes too late after data has been inputted into the corresponding latch (260) and the value of L_ADDR has not been changed before the next E_NWR goes high, the succeeding data will be input into the wrong latch (262), especially the preceding latch. Therefore, the original data held in the corresponding latches is lost.

Similar scenarios happened in the HWM mode. As shown in FIG. 2E, every time the data has been inputted into latch L4, the value of HWM_ADDR changes to 00 automatically with a delay time. However, if the clock signal CLK 282 comes after the new incoming E_NWR 280, the data held in latch L1 will be overwritten by the new inputted data (284), and the original data which prepares to be written into SRAM 106 is lost.

The asynchronous design for a clock signal CLK reduces the power consumption, which is suitable to small, portable electronic devices. However, in order to prevent data from being overwritten by a delayed clock signal CLK, the period for two consecutive write requests, called the cycle of writing (CYCW), is limited to be long enough. The limitation for CYCW limits the process efficiency, especially the speed for the write operation. If we can ensure that the data held in the SRAM controller won't be overwritten by succeeding the inputted data even if the clock signal CLK comes too late, the limitations for CYCW could be restricted, so that the designer may reduce the CYCW and increase the write speed.

SUMMARY OF THE INVENTION

According to foregoing motives, an method for writing data into the memory, which is capable of avoiding data overwriting, is disclosed. The invention utilizes two layers of latches to hold the inputted data from a data bus and the data that prepares to be written into the memory respectively. Even if the succeeding data is inputted, the original data held in the access controller will not be overwritten before being written into the memory, and the limitations for the CYCW may be reduced by selectively opening/closing the communication between two layers of latches.

According to the first aspect of the present invention, a method for writing data into the memory is provided. The method includes the steps of: inputting a sequence of data into a set of first latches, the set of first latches being respectively connected to a set of second latches; detecting whether a succeeding write request arrives before a current write operation finishes, indicative of a delay situation; disconnecting the second latches from the first latches when the delay situation is detected; and writing the sequence of data held in the set of second latches into the memory according to a clock signal.

The invention also provides an improved architecture of access controller of a single-port memory system, which is capable of avoiding data overwriting when a succeeding write operation starts before a current write operation is finished. One embodiment of the present invention utilizes two layers of latches, and detects the foregoing condition to selectively close the communication between the two layers of latches. An another embodiment of the invention which utilizes two layers of latches that are usually isolated, and the communication between two layers of latches is restored only during a specific period for preventing data overwriting.

According to the second aspect of the present invention, an access controller for the single-port memory system is provided. The access controller includes: an address generator for generating an latch address; an address register for storing a pre-changed latch address; a set of first latches, which receives a sequence of input data according to the pre-changed latch address; a set of second latches for holding a sequence of write data which is prepared to be written into the memory; a signal generator for generating a clock signal, wherein the sequence of write data held in the second latches is written into the memory according to the clock signal, the latch address, and a write address of the memory; and means for controlling the communication between the first latches and the second latches.

Further scope of the applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus are not limitative of the present invention, and wherein.

DETAILED DESCRIPTION OF THE INVENTION

The present invention will now be described in detail with reference to the drawings, which are provided as illustrative examples of the invention so as to enable those skilled in the art to practice the invention. Notably, the implementation of certain elements of the present invention may be accomplished using software, hardware, firmware or any combination thereof, as would be apparent to those of ordinary skill in the art, and the figures and examples below are not meant to limit the scope of the present invention. Moreover, where certain elements of the present invention can be partially or fully implemented using known components, only those portions of such known components that are necessary for an understanding of the present invention will be described, and detailed descriptions of other portions of such known components will be omitted so as not to obscure the invention.

As in the foregoing descriptions, the original SRAM controller SRAM_CTRL 100 of the prior art utilizes one layer of latches for temporarily holding the data, thereby resulting in the possibility that the data held in the SRAM controller is overwritten by succeeding input data. The invention provides a new architecture for SRAM controller SRAM_CTRL that prevents data from overwriting, thereby increasing the speed for write operation by loosening the limitations for CYCW.

Figure 1:
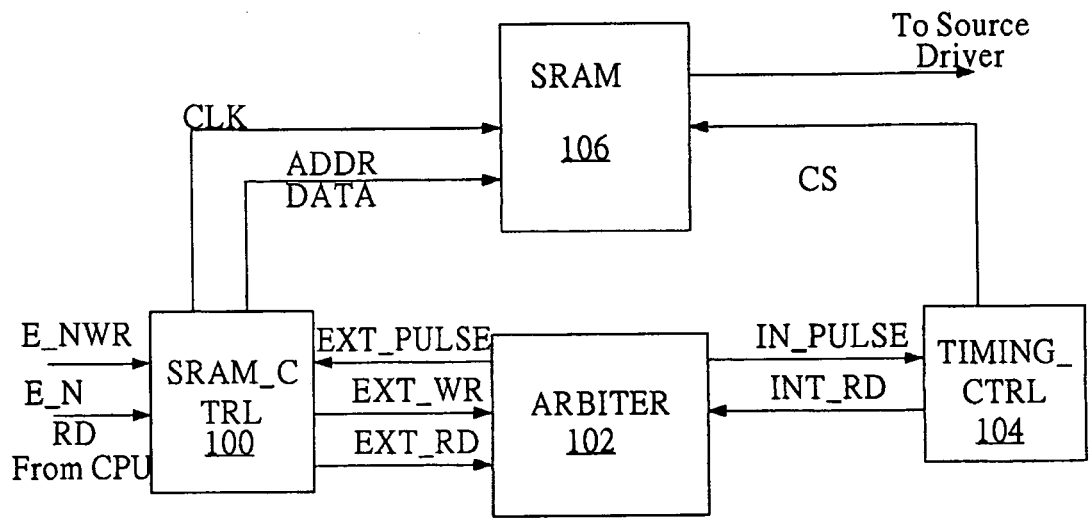
FIG. 1 illustrates a conventional single-port SRAM system.
Figure 2A:
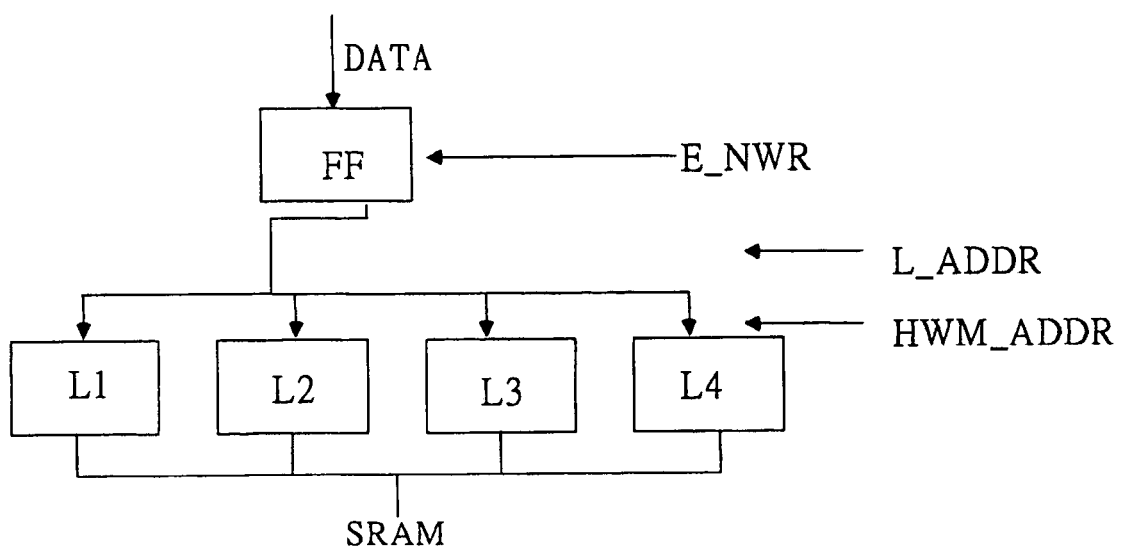
FIG. 2A illustrates a conventional SRAM controller of the single-port SRAM system.
Figure 2B:
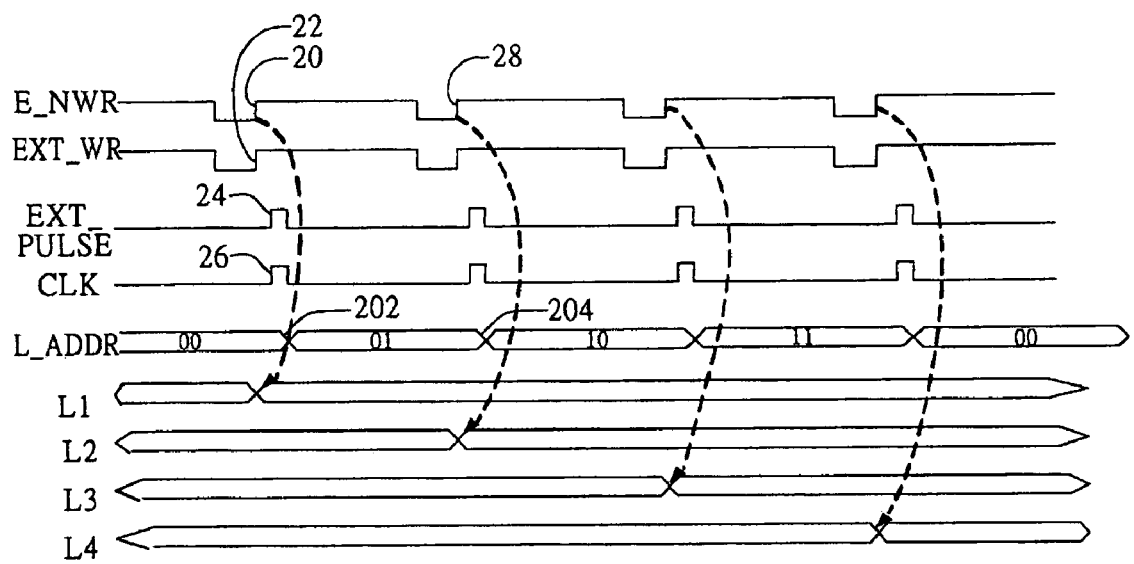
FIG. 2B illustrates the relevant timing diagram of the single-port SRAM system as operating in normal mode.
Figure 2C:
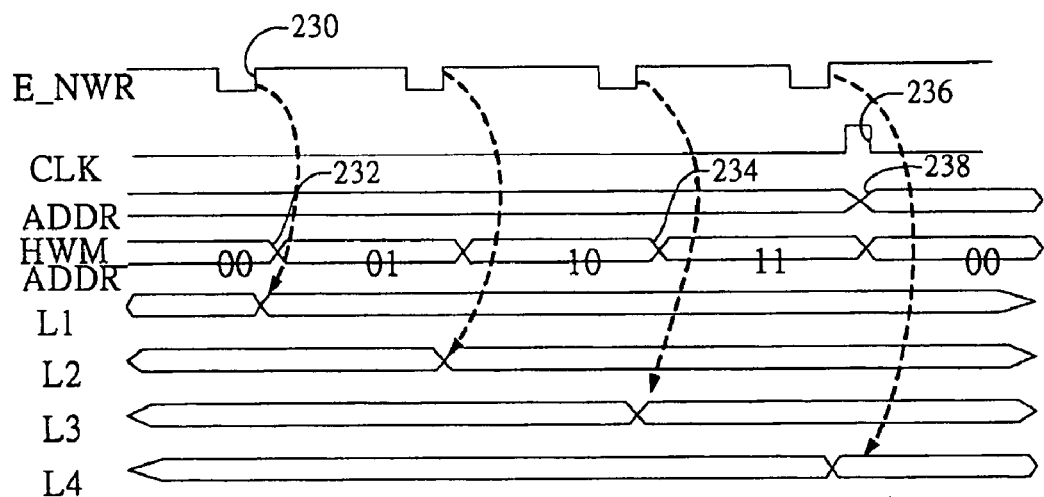
FIG. 2C illustrates the relevant timing diagram of the single-port SRAM system as operating in HWM mode.
Figure 2D:
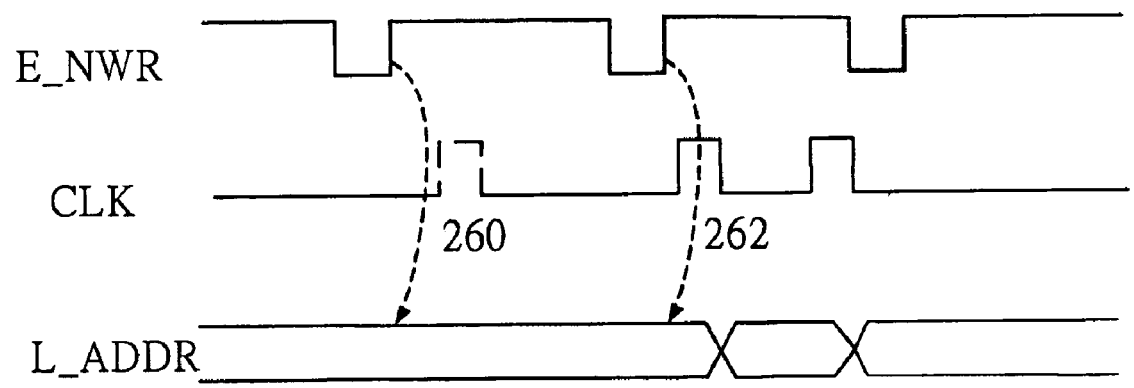
FIG. 2D illustrates the relevant timing diagram with a delayed clock signal as operating in normal mode.
Figure 2E:
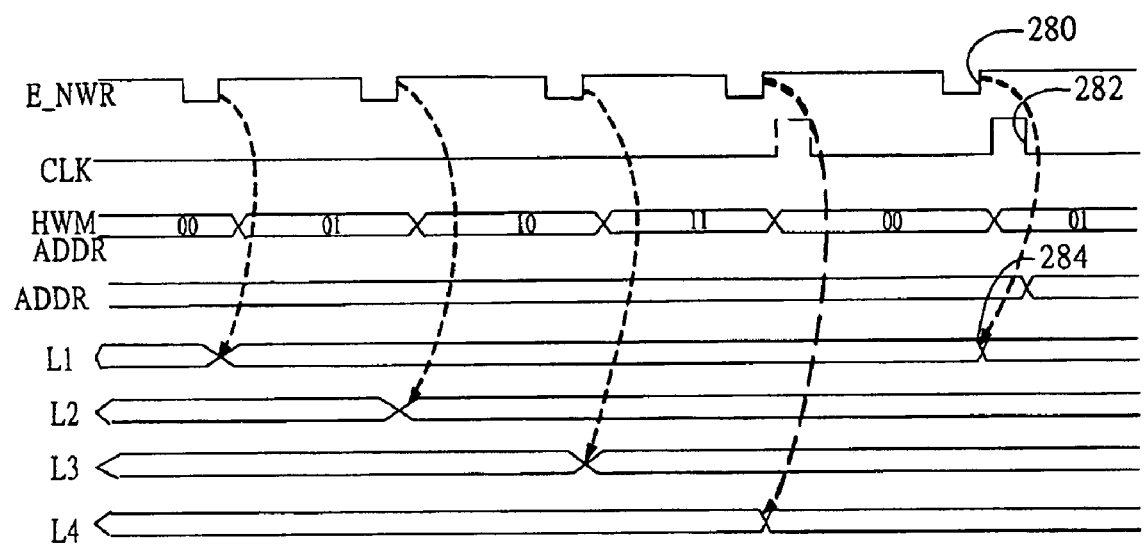
FIG. 2E illustrates the relevant timing diagram with a delayed clock signal as operating in HWM mode.
Figure 3A:
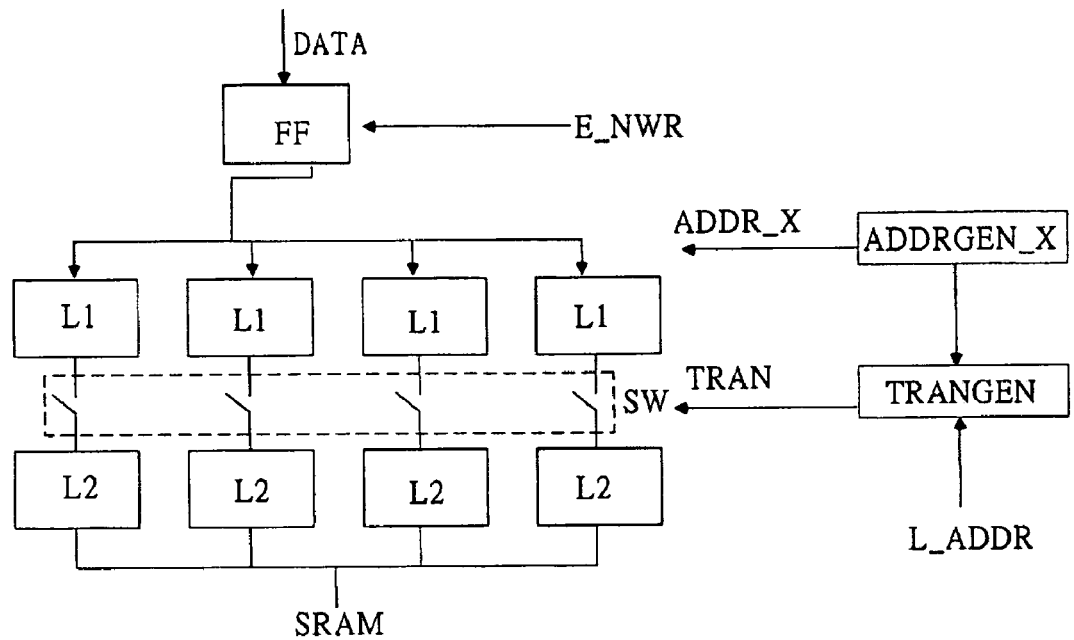
FIG. 3A illustrates an embodiment of the invention, specially an improved architecture for SRAM controller having two layers of latches.
Figure 3B:
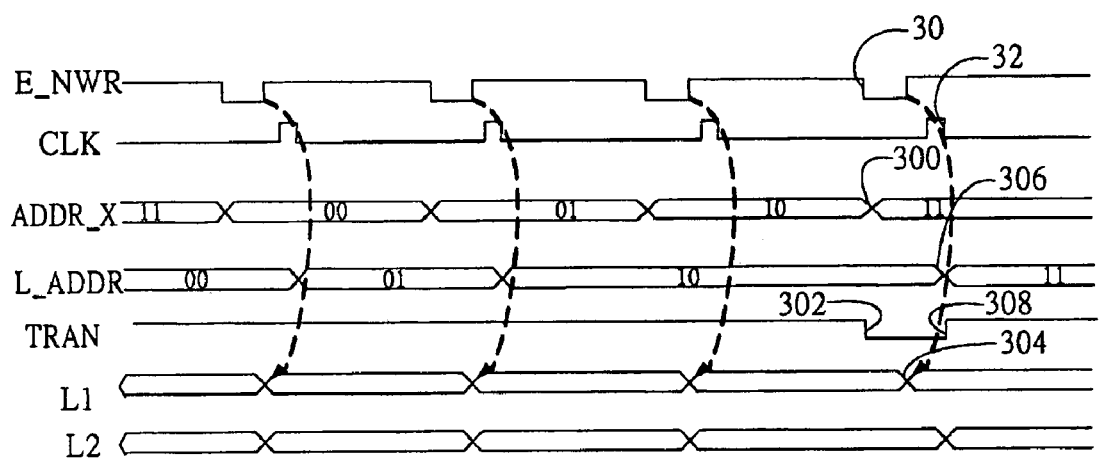
FIG. 3B illustrates the relevant timing diagram for the present SRAM controller as shown in FIG. 3A.

For solving the problem that a new write request for succeeding write operation comes before the current write operation is completed, the improved architecture of the SRAM_CTRL has two layers of latches compared to that in prior art. FIG. 3A illustrates an embodiment of the invention for a SRAM controller that has two layers of latches, a set of switches SW between the two layers of latches, and a new address register ADDRGEN_X for storing a new address ADDR_X as operating in normal mode. FIG. 3B is the relevant timing diagram of the write operation for the improved SRAM_CTRL. Unlike the address L_ADDR in the prior art, the new address ADDR_X changes its value as the external write request comes and goes low, in the other words, ADDR_X changes before L_ADDR. Besides, there is a further signal generator TRANGEN for generating a detecting signal TRAN that detects if a new E_NWR goes high before the clock signal CLK goes low. Normally the detecting signal TRAN stays high, but it goes low when the succeeding E_NWR comes earlier before the clock signal CLK is generated.

Unlike the SRAM controller SRAM_CTRL 100 of the prior art, data in the flip-flop FF is inputted into the first-layer of latches L1 according to the pre-changed latch address ADDR_X, and the data which will be written into the SRAM 106 is outputted from the second-layer of latches L2 according to the address L_ADDR. In other words, the first-layer of latches L1 are used to receive the inputting data, but the data that will be actually written into the SRAM 106 is held in the second-layer of latches L2. Usually, the first-layer of latches and the second-layer of latches are electrically communicated when the detecting signal TRAN stays high, therefore the values held in the first-layer of latches L1 are the same as those held in the second-layer of latches L2. However, if an external write request E_NWR 30 of the succeeding write operation comes before the clock signal CLK 32 goes low, the pre-changed latch address ADDR_X changes as E_NWR 30 goes low (300). Then signal generator TRANGEN detects the condition, the detecting signal TRAN goes low (302) to cut off the communication between the first-layer of latches L1 and second-layer of latches L2. In the following, E_NWR 30 goes high, which triggers the data on a data bus to be inputted into the first-layer of latches L1 according to the ADDR_X (304). Because the communication between the first-layer of latches L1 and the second-layer of latches L2 is closed (TRAN is set to low), the values held in the second-layer of latches L2 won't be overwritten by the succeeding data. Next, after receiving the acknowledge signal EXT_PULSE from the arbiter, the clock signal CLK 32 is generated and sent into the SRAM, and the values held in the second-layer of latches L2 will be written into the proper memory addresses of the SRAM in accordance to the write address ADDR. Afterwards the data held in the second-layer of latches has been totally written into the SRAM 106, the clock signal CLK goes low to change the value of the L_ADDR (306), making the detecting signal TRAN return to high (308). After TRAN returns to high, the communications between the first-layer of latches and the second-layer of latches is restored.

As mentioned above, by utilizing two layers of latches and the mechanism that isolating the two layers of latches as the clock signal CLK comes too late, the input data of current write operation that has not been written into the SRAM yet won't be lost even the clock signal CLK comes later than the new incoming E_NWR. Therefore, the limitations for CYCW may be loosened so that the SRAM system is able to increase the write speed.

Figure 4A:
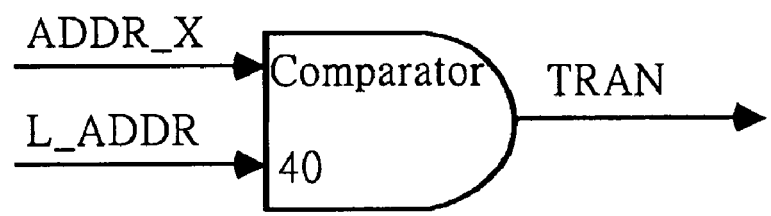
FIG. 4A illustrates an example of signal generator TRANGEN of the SRAM controller.

The set of switches SW are used in this embodiment of the invention, which controls the communication between two layers of latches according to the detecting signal TRAN. The signal generator TRANGEN for generating the detecting signal TRAN may be simply a comparator, as shown in FIG. 4A, which compares the latch address L_ADDR with the pre-changed latch address ADDR_X to output TRAN. When the value of ADDR_X is larger than the value of L_ADDR, it means a new write request E_NWR is coming, but the clock signal CLK has not been generated yet. Hence the comparator 40 outputs the TRAN with lower potential until ADDR_X is not lager than L_ADDR. It's noticed that the value of ADDR_X and L_ADDR change following the order of 00->01->10->11->00->01-> . . . , therefore it's assumed that 11 is smaller than 00 when the comparator 40 operates.

Figure 4B:
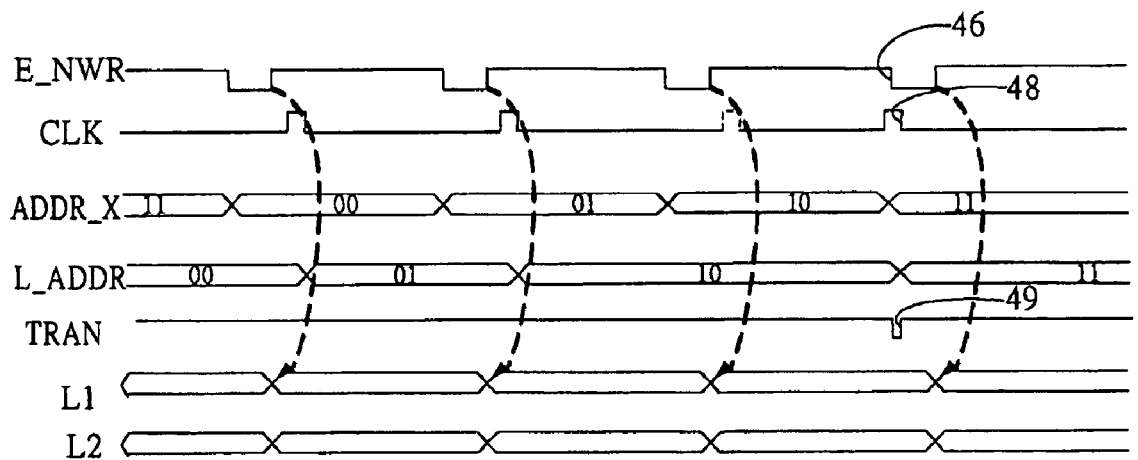
FIG. 4B illustrates the timing diagram of SRAM controller with a delayed clock signal.

FIG. 4B shows a special condition that the clock signal CLK comes before the succeeding write request E_NWR but overlaps for a short time interval. Because E_NWR 46 still goes high before CLK 48 goes low, it's not necessary to close the communication between the two layers of latches under this condition. However, according to the comparator 40, the TRAN still goes low during the period 49, which is meaningless at present. Although utilizing a comparator as mentioned above to generate the detecting signal TRAN may result in a redundant operation of isolating two layers of latches under the foregoing special condition, it doesn't influence the correctness for detecting a delayed clock signal CLK.

Figure 4C:
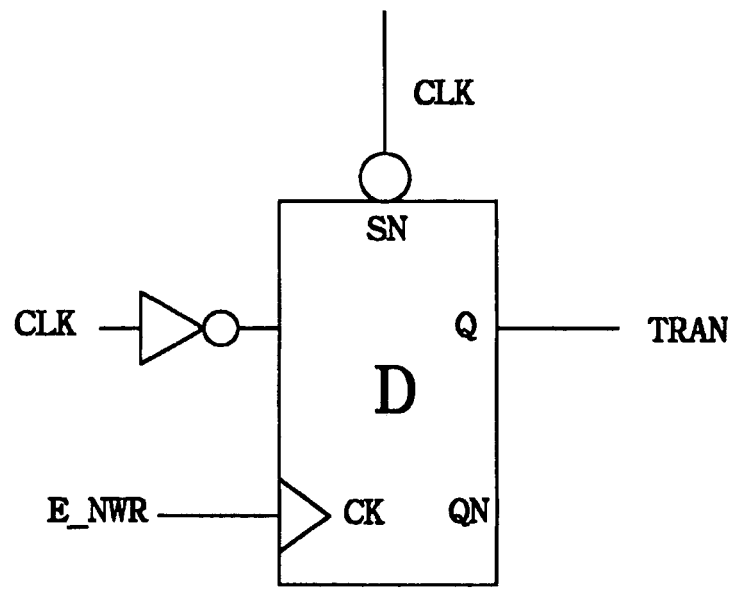
FIG. 4C illustrates an another example of signal generator TRANGEN of the SRAM controller.
Figure 4D:
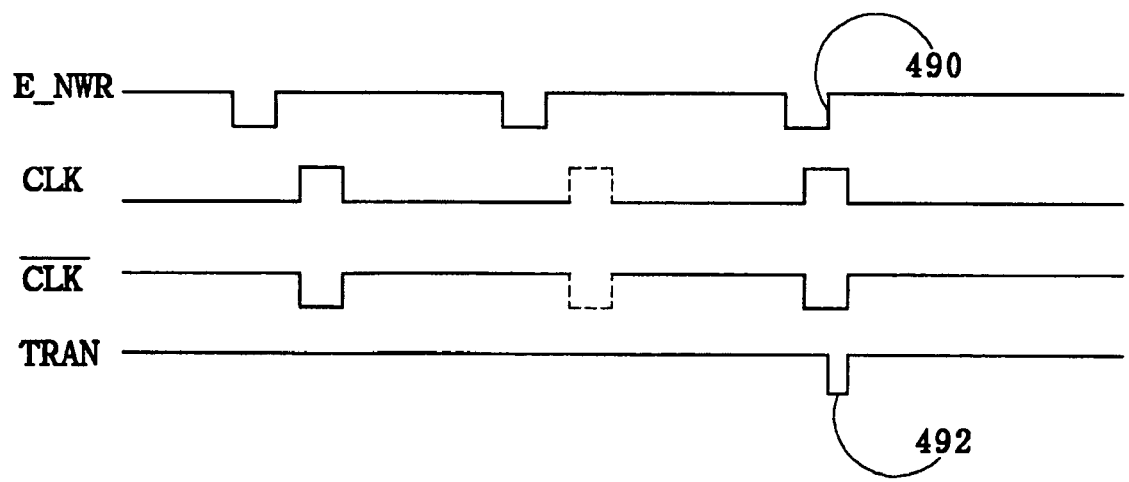
FIG. 4D illustrates the timing diagram for the signal generator TRANGEN of FIG. 4C.

Except for the mentioned composition of a comparator and a set of switches, the other means for controlling the communication between two layers of latches, detecting if a write request of succeeding write operation comes before the current write operation is finished, and means for isolating two layers of latches are not limited in the invention. For instance, as shown in FIG. 4C, a D flip-flop is used to generate detecting signal TRAN. As E_NWR goes high, D flip-flop checks if the clock signal CLK changes its value (especially for CLK going high). If yes, TRAN goes low; if not, TRAN stays high. In addition, D flip-flop further has a reset port SN to trigger TRAN return high as CLK stays low. FIG. 4D is the relevant timing diagram of FIG. 4C. If CLK stays high as E_NWR goes high (490), the output signal TRAN goes low (492) and remains its potential. Until CLK goes low to make the reset port SN goes high, D flip-flop resets TRAN back to high potential once again. Beside, the pre-changed latch address ADDR_X may change its value as the clock signal CLK goes high instead of as E_NWR goes low because the communication between two layers of latches is closed as E_NWR goes high.

Figure 5A:
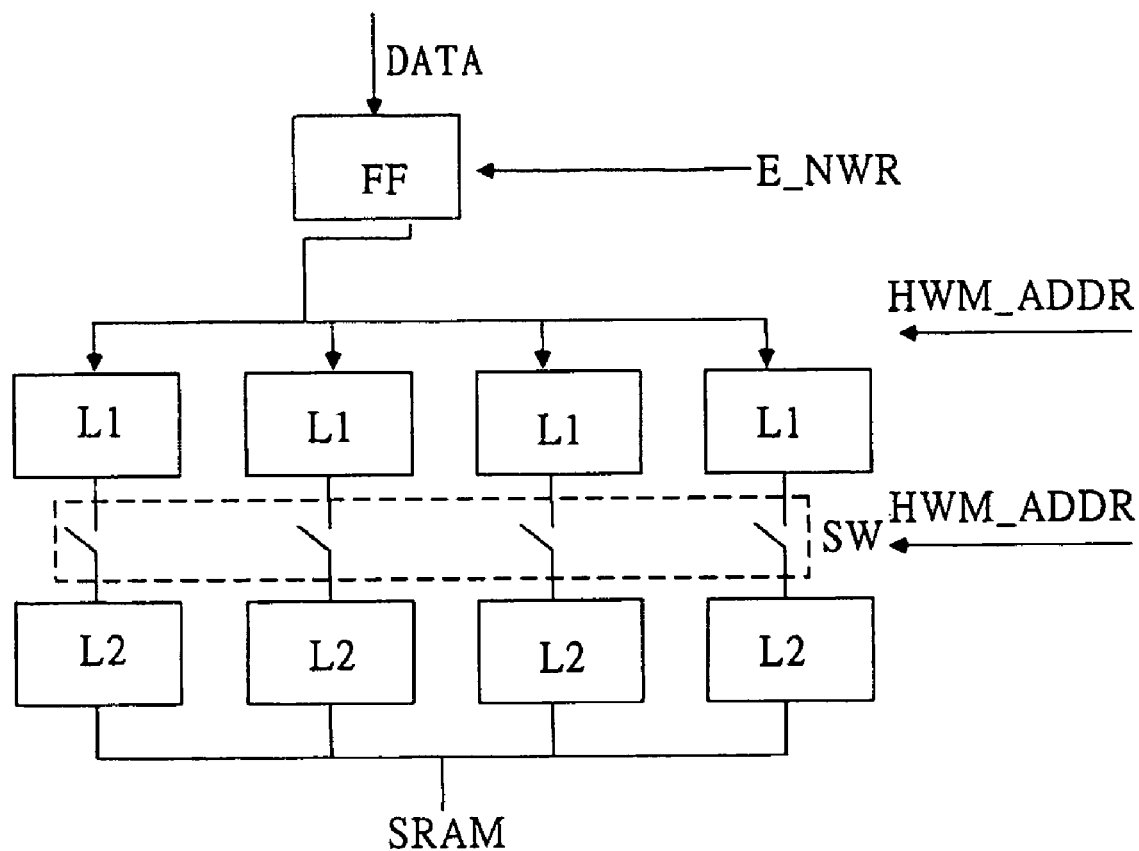
FIG. 5A illustrates another embodiment of the invention, specially an improved architecture for SRAM controller having two layers of latches.
Figure 5B:
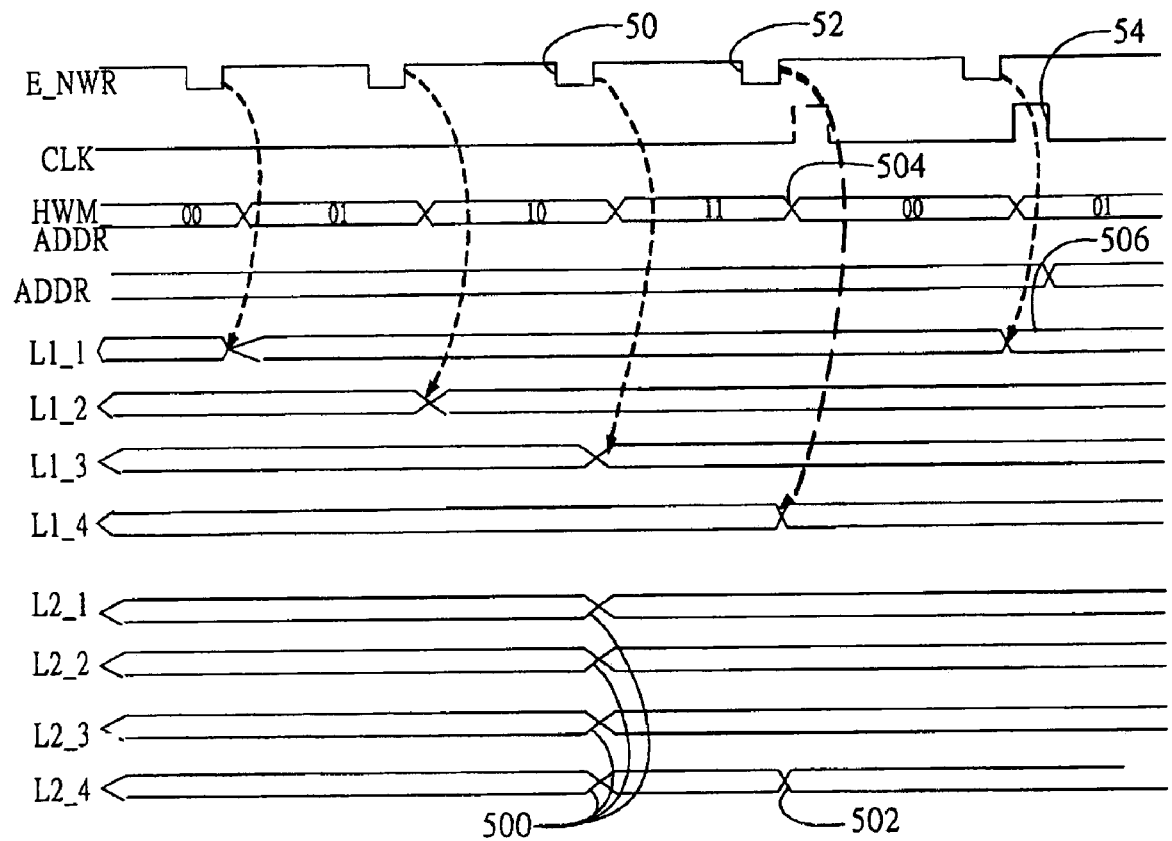
FIG. 5B illustrates the relevant timing diagram for the present SRAM controller as shown in FIG. 5A.

FIG. 5A illustrates another embodiment of the invention for a SRAM controller while operating in the HWN mode, which has two layers of latches and a set of switches between the first-layer of latches and the second-layer of latches. In this embodiment of the invention, the first-layer of latches L1 (includes latch L1_1~L1_4) and second-layer of latches L2 (includes L2_1~L2_4) are usually isolated. As the foregoing descriptions, the data is input into corresponding latches by latch address HWM_ADDR. HWM_ADDR changes its value with a time delay (about 10 ns) automatically after E_NWR goes high, and the new HWM_ADDR is used to determine which latch the data will be inputted as the succeeding E_NWR comes. The foregoing steps repeat until the value of HWM_ADDR becomes 11. The communication between the fist-layer of latches L1 and the second-layer of latches L2 is restored as HWM_ADDR having a value of 11, which makes the second-layer of latches L2 have the same values to the first-layer of latches L1 (500). The first-layer of latches L1 keep communicating to the second-layer of latches L2 as long as the value of HWM_ADDR remains at 11. As the succeeding E_NWR 50 comes and goes high, data is input into latch L1_4 of the first-layer of latches and transferred into latch L_2_4 immediately (502) because the first-layer latch L1 is communicating with the second-layer latch L2 as HWM_ADDR remains at 11. Afterwards HWM_ADDR returns to 00 (in 10 ns) (504), the communication between the first-layer of latches L1 and the second-layer of latches L2 is closed once again. After receiving the acknowledge signal EXT_PLUSE from the arbiter, SRAM-CTRL 100 generates a clock signal CLK and sends it into the SRAM, and then the data held in the second-layer of latches L2 is written into the SRAM according to the write address ADDR.

Because the first-layer of latches L1 are isolated from the second-layer of latches L2 again as HWM_ADDR returns to 00, even if the new external write request E_NWR 52 has come and the clock signal CLK 54 is not been generated yet, the succeeding data is still input into the first-layer of latches of the SRAM_CTRL (506), but the data held in the second-layer of latches maintains original values because of the isolation between the two layers of latches. Therefore, the invention prevents data from overwriting by succeeding write operation.

Summarily speaking, the present SRAM controller of the invention utilizes a layer of latches for holding inputted data and an another layer of latches for holding the data which is prepared to be written into the SRAM independently. As mentioned above, an additional layer of latches, a address register ADDRGEN_X for the pre-changed latch address ADDR_X, a signal generator TRANGEN for generating a detecting signal TRAN, and a switch for controlling the communications between the two layers of latches are added in the embodiments of the invention. Besides, the methods for writing data into the SRAM as operating in normal mode and in the HWM mode are provided. In the normal mode, the SRAM controller detects a delay condition, which occurs when a new write operation comes before the current write operation is finished. If the delay condition occurs, the SRAM controller cuts off communications between the two layers of latches to prevent the data from the current write operation from being overwritten by the data of the succeeding write operation. The communication between the two layers of latches will be restored until the current write operation has been completed. With regards to the HWM mode, the first-layer of latches are usually isolated with the second-layer of latches but communicates with each other during a specific period. If the succeeding write operation comes before the current write operation is finished, the data of the current write operation will not be lost (overwritten by the data of succeeding write operation) because the two layers of latches communicates merely during the specific period.

It's noticed that the invention not only adapts to the SRAM system but also other memory systems with a single-port architecture. Besides, as long as the communication between the input layer of latches (first-layer of latches in foregoing embodiments) and the output layer of latches (second-layer of latches in foregoing embodiments) is properly controlled, the SRAM controller (access controller) may have more layers of latches for holding the inputted data temporarily before transferring it to the second-layer of latches. In other words, it's allowable to have more layers of latches between the first layer-latch and the second-layer latches, and the sets of switches are increased with the amount of layers of latches.

It should be understood that the inventions described herein are provided by way of example only and the numerous changes, alternations, modification, substitutions may be made without departing from the spirit and scope of the inventions as delineated within the following claims.

What we claim is:

1. A method of writing data into a single-port memory, said method comprising:
   inputting a sequence of data into a set of first latches, said set of first latches being respectively connected to a set of second latches;
   detecting whether a succeeding write request arrives before a current write operation finishes, indicative of a delay situation;
   disconnecting the second latches from the first latches when the delay situation is detected; and
   writing the sequence of data held in the set of second latches into the memory according to a clock signal.

2. The method according to claim 1, wherein said clock signal is generated whenever a write permission is obtained.

3. The method according to claim 1, wherein said sequence of data is input to the first latches according to a pre-changed latch address, and said sequence of data held in said second latches is written into the memory according to of a latch address.

4. The method according to claim 3, wherein said pre-changed latch address is generated at a beginning of the write request, and said latch address is generated at an end of the clock signal.

5. The method according to claim 3, wherein said pre-changed latch address is generated at a beginning of the clock signal, and said latch address is generated at an end of the clock signal.

6. The method according to claim 3, wherein said detecting step comprises generating a detecting signal indicative of the delay situation according to the pre-changed latch address and the latch address.

7. A method of writing data into a single-port memory, wherein the single-port memory, said method comprising:

inputting a sequence of data into a set of first latches;

reconnecting said first latches to a set of second latches whenever a latch address indicates the last input latch of said first latches, wherein said first latches are isolated with said second latches originally; and writing the sequence of data held in the set of second latches into the memory according to a clock signal.

8. The method of claim 7, wherein said clock signal is generated whenever a write permission is obtained.

9. The method of claim 7, wherein said latch address changes its value with a delay time automatically after a write request.

10. The method of claim 7 further comprising utilizing a set of switches to control the communication between said first latches and said second latches.

11. A device for controlling write operation of a single-port memory, said device comprising:

an address generator for generating an latch address;

an address register for storing a pre-changed latch address;

a set of first latches, which receives a sequence of input data according to said pre-changed latch address;

a set of second latches for holding a sequence of write data which is prepared to be written into the memory;

a signal generator for generating a clock signal, wherein said sequence of write data held in said second latches is written into the memory according to said clock signal, said latch address, and a write address of the memory; and means for controlling the communication between said first latches and said second latches.

12. The method of claim 11, wherein said latch address is formed of the partial bits of said write address of the memory.

13. The method of claim 11, wherein said address generator for generating the latch address is a register.

14. The device of claim 11 wherein said means for controlling the communication between said first latches and said second latches further comprising:

means for detecting a delay condition, which occurs when a succeeding write operation arrives before a current write operation finished; and means for closing the communication between said first latches and said second latches if said delay condition occurs.

15. The device of claim 14, wherein said means for closing the communication between said first latches and said second latches comprises a set of switches.

16. The device of claim 14, wherein said means for detecting said delay condition comprises a comparator, which compares said latch address with said pre-changed latch address for determining if said delay condition exist.

17. The device of claim 14, wherein said means for detecting said delay condition comprises a D flip-flop.

18. The device of claim 11, wherein said pre-changed latch address changes its value with the beginning of a write request and said latch address changes its value with the end of said clock signal.

19. The device of claim 11, wherein said pre-changed latch address changes its value with the beginning of said clock signal and said latch address changes its value with the end of said clock signal.

20. A device for controlling write operation of a single-port memory, said device comprising:

an address generator for generating a latch address;

a set of first latches, which receives a sequence of input data according to said latch address;

a set of second latches for holding a sequence of write data which is prepared to be written into the memory;

a signal generator for generating a clock signal, wherein said sequence of write data held in said second latches is written into the memory according to said clock signal and a write address of the memory; and means for controlling the communication between said first latches and said second latches.

21. The device of claim 20 wherein said means for controlling the communication between said first latches and said second latches comprising a set of switches, which restores the communication between said first latches and said second latches when said latch address indicates the last input latch of said first latches.

* * * * *